United States Patent
del Puerto

(12) 
(10) Patent No.: US 6,947,125 B2
(45) Date of Patent: Sep. 20, 2005

(54) BEARING ARRANGEMENT FOR REACTION MASS IN A CONTROLLED ENVIRONMENT

(75) Inventor: Santiago E. del Puerto, Milton, NY (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/648,263

(22) Filed: Aug. 27, 2003

(65) Prior Publication Data

US 2005/0046820 A1 Mar. 3, 2005

(51) Int. Cl.$^7$ .............................................. G03B 27/42
(52) U.S. Cl. ........................... 355/75; 355/72; 355/53; 310/10; 310/12; 318/649
(58) Field of Search ............................ 355/53, 72, 75; 318/649; 310/10, 12

(56) References Cited

U.S. PATENT DOCUMENTS

| | | | |
|---|---|---|---|
| 6,126,169 A | * 10/2000 | Sogard et al. | .............. 277/321 |
| 6,614,508 B2 | * 9/2003 | Phillips et al. | ................ 355/72 |
| 6,765,650 B2 | * 7/2004 | Novak | .......................... 355/72 |
| 6,794,660 B2 | 9/2004 | Watson | |
| 2002/0104453 A1 | * 8/2002 | Lee et al. | ................ 101/450.1 |
| 2002/0105481 A1 | * 8/2002 | Lee et al. | ....................... 430/9 |
| 2004/0160585 A1 | * 8/2004 | Jacobs et al. | ................. 355/53 |

OTHER PUBLICATIONS

Muller, Gerrit, "The Waferstepper Challenge: Innovation and Reliability despite Complexity," Version 1.0, Embedded Systems Institute, May 21, 2003 (12 pages).

* cited by examiner

Primary Examiner—D. Rutledge
(74) Attorney, Agent, or Firm—Sterne, Kessler, Goldstein & Fox P.L.L.C.

(57) ABSTRACT

A reaction mass apparatus for stabilizing a scanning system during lithographic processing comprises a baseframe; at least one reaction mass movably coupled to the baseframe by at least three first bearings and coupled to a stage by at least two second bearings and at least one drive; and a plurality of bellows, each bellows surrounding a corresponding first bearing, the bellows each having a first end coupled to a reaction mass and a second end coupled to the baseframe. The apparatus can comprise an enclosure, containing a controlled environment and enclosing the stage, the second bearings, the drive, and the reaction mass, wherein each bellows separates a corresponding first bearing from the controlled environment and wherein each bellows second end is coupled to the enclosure.

41 Claims, 5 Drawing Sheets

BEARING ARRANGEMENT FOR REACTION MASS IN A CONTROLLED ENVIRONMENT

BACKGROUND OF THE INVENTION

1. Field of the Invention

This invention relates generally to lithographic processing. More particularly, this invention relates to an improved bearing arrangement for a reaction mass used for lithographic processing within a controlled environment.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. During lithography, a wafer is disposed on a wafer stage and held in place by a chuck. The chuck is typically a vacuum or electrostatic chuck capable of securely holding the wafer in place. The wafer is exposed to an image projected onto its surface by exposure optics located within a lithography apparatus. While exposure optics are used in the case of photolithography, a different type of exposure apparatus can be used depending on the particular application. For example, x-ray, ion, electron, or photon lithographies each may require a different exposure apparatus, as is known to those skilled in the relevant art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be stepped between field exposures to allow multiple copies of a reticle pattern to be exposed over the wafer surface. In this manner, the sharpness of the image projected onto the wafer is maximized.

While using a step-and-scan technique generally assists in improving overall image sharpness, image distortions may occur in such systems due to movement of the entire system caused by the acceleration of the reticle stage or wafer stage. One way to correct this is by providing a counter balance (also referred herein as a reaction mass) to minimize the movement of the lithographic system upon acceleration of a stage. The reaction mass reacts to the force applied by the acceleration of a stage to prevent that force from affecting the overall lithography system during processing. In this way, reaction mass mechanisms eliminate stage-induced system vibration, which has the beneficial effect of increasing focus budgets and image contrast. Using a reaction mass mechanism allows rapid-motion scanning without transferring reaction forces to the machine baseframe, thus avoiding shaking the lithography system with every pass of the stage, which would disturb sensitive processing.

Typically, reaction mass mechanisms are guided by bearings or flexures. Flexures are thin vertical plates, attached at a protrusion at each end of a reaction mass such that when a stage coupled to the reaction mass accelerates, the reaction mass moves in the opposite direction as the stage, in a manner supported and guided by the flexures. The movement of the reaction mass in the opposite direction helps to stabilize the lithography system during processing. The ends of the flexures that are not coupled to the reaction mass are coupled to another entity, such as a baseframe. In this way, both ends of a flexure are constrained so that the flexure cannot rotate upon movement of the reaction mass. Flexures usually include one or more groove-like channels at each end for flexibility in supporting the reaction mass. The channels can be angular, rounded, or of any shape that will allow flexibility in the flexure.

An advantage of using flexures is that flexures can be used to guide one or more reaction masses in controlled environments such as purged gas mini-environments or high vacuum chambers. An advantage that the use of flexures has over the use of bearings is that flexures will not contaminate the environment as would, for example, the gas of a gas (or air) bearing or the lubricant of a roller bearing. Typically, flexures that are used in these controlled environments are flexures that are capable of accommodating a limited range of motion. By increasing the mass of the reaction mass, the required range of motion of the reaction mass is reduced to the point that flexures can be used. A reaction force is the product of the mass of the stage and the acceleration of the stage. Since the reaction force is also equal to the product of the mass of the reaction mass and the acceleration of the reaction mass, increasing the mass of the reaction mass reduces its acceleration, velocity and displacement.

However, the use of flexures presents a variety of problems in addition to extra-heavy reaction masses. For example, upon acceleration of a stage coupled to a reaction mass, the reaction mass will move in an arcuate path instead of the desired straight line due to the flexibility of the flexures. In other words, the flexures each shorten with a quadratic error. The effect of the quadratic error is an unbalanced up-and-down motion of the reaction mass. The arcuate motion caused by the quadratic error results in undesirable vertical reaction forces. The straying from straight line motion causes transverse forces to transfer to the baseframe of the system. Not only could this cause unwanted movements of the system during lithographic processing, but this also may cause a clearance problem between the bouncing reaction mass and a linear motor, if used to drive the stage. Complex flexure systems have been proposed, which in theory produce a straight line. However, in practice, the straight line motion is highly sensitive to manufacturing tolerances. For example, all flexures used would have to be exactly the same length, bend in exactly the same way, and be attached perfectly for a purely straight line motion to result.

Another shortcoming of flexure use is that the bending of flexures, alone, transfers some of the reaction force to the baseframe. Another shortcoming when using a heavy reaction mass is that it is difficult to achieve infinite fatigue life of the flexures. To achieve an infinite fatigue life, the flexures would have to be very long, which becomes difficult to package.

The use of bearings, on the other hand, provides a simpler arrangement that naturally produces substantially straight motion. One shortcoming of bearing use in general, however, is that a number of bearings are needed to guide the reaction mass (e.g., some are needed underneath the reaction mass, some are needed on the sides, etc.). With a split reaction mass stage, where at least two reaction masses are used, at least twice as many bearings are needed.

Although various types of bearings can be used (e.g., ball bearings, roller bearings, wheels, etc.), gas bearings are preferred in lithography systems because of good rectilinear motion. When using gas bearings, movement remains planar as long as the surface traveled over is fairly planar. Gas bearings do not present "lack of roundness" and "stick-slip" issues as one may have with wheel or ball bearings. The extremely low friction of gas bearings also conserves momentum, minimizing motor size. In addition, transmitted vibration is significantly reduced when using gas bearings because air is used instead of a solid object such as a ball. Potential contaminants, such as the lubricant in a ball or roller bearing are not present with gas bearings.

Although cylindrical gas bearings have been used with cylindrical rods as guideways inside high vacuum systems, their use is not favored for supporting the reaction masses of lithography systems. The main problem is that the cylindrical configuration is not well suited for supporting a heavy reaction mass. Large guide rod diameters are required for sufficient lift and to minimize guide rod deflection under the heavy load. Dynamically sealing against gas leakage into the vacuum chamber requires at least two pre-vacuum grooves in each cylindrical air bearing, which in turn demand additional vacuum pumps, resulting in an expensive system. The dynamic nature of the seal can result in some leakage of air bearing gas into the vacuum chamber, which increases the required size of the main vacuum pumps. Potential failure of the seal poses a high risk of catastrophic contamination within the controlled environment.

What is needed is a reaction mass system used in conjunction with linear stages that stabilizes a lithographic system during processing in a controlled environment, without the deficiencies associated with reaction mass systems described above.

BRIEF SUMMARY OF THE INVENTION

A system for stabilizing a scanning system during lithographic processing is described. The system according to the present invention includes a baseframe, at least one reaction mass, and a plurality of bellows. The reaction mass is movably coupled to the baseframe by at least three first bearings and coupled to a stage by at least two second bearings and at least one drive. Each bellows surrounds a corresponding first bearing. In one embodiment of the present invention, each bellows has a first end coupled to the reaction mass and a second end coupled to the baseframe. In one embodiment of the present invention, the first bearings are fluid bearings in which, according to one embodiment, the fluid is a pressurized gas, and according to another embodiment, the fluid is a liquid film. For high lifting efficiency and low cost, all fluid bearings and guideways on which they ride are planar instead of cylindrical. In another embodiment, the first bearings are roller bearings. In yet another embodiment, the first bearings are ball bearings. In still another embodiment, at least one first bearing is positioned such that it linearly guides a reaction mass.

The system according to the present invention can further include an enclosure having a controlled environment. The enclosure encloses the stage, the second bearings, the drive, and the reaction mass. In this embodiment, each bellows separates a corresponding first bearing from the controlled environment and each bellows' second end is coupled to the enclosure. In an embodiment, the volume of each bellows has a pressure that is independent of the pressure of the volume of the enclosure. This means that the volume of each bellows can be at atmospheric pressure even if the controlled environment is not at atmospheric pressure. In one embodiment, the baseframe is uncoupled from the enclosure. In another embodiment, the baseframe is coupled to the enclosure via rigid supports. In yet another embodiment, the baseframe is coupled to the enclosure via flexible supports. The enclosure can further enclose lithographic exposure means, including an illuminator with which to illuminate a mask located on a mask stage and a projection optics with which to project an image of the illuminated mask onto a substrate located on a substrate stage.

In a system according to the present invention, the drive comprises a linear motor coil coupled to the stage and a magnet coupled to a reaction mass, wherein the linear motor coil and the magnet are coupled magnetically.

In a system according to the present invention, the mass of the stage is X times less than the mass of the reaction mass, resulting in the reaction mass moving, upon acceleration of the stage, a distance 1/X the distance of the stage. Each bellows is sized such that it can move with the reaction mass upon movement of the stage.

Further embodiments, features, and advantages of the present invention, as well as the structure and operation of the various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

Figure 1A:
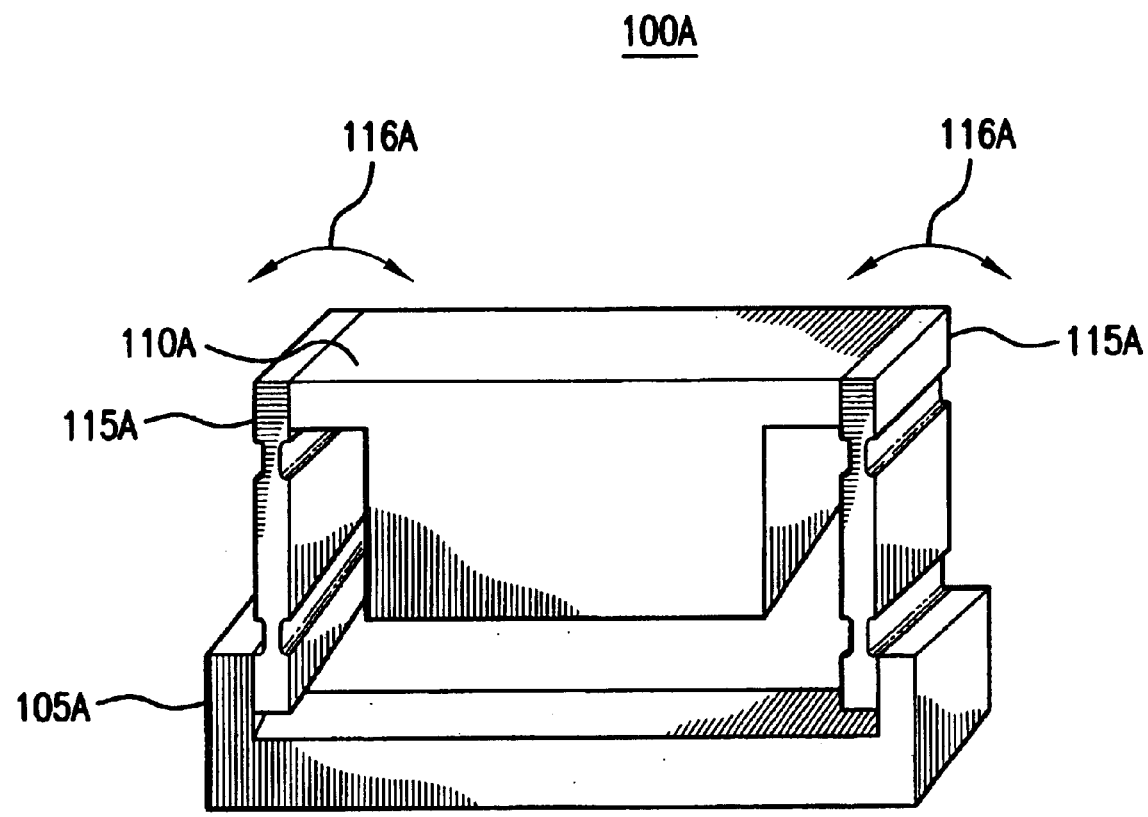
FIG. 1A is an exemplary illustration of a linear spring with flexures that follow a frown-shaped arcuate path upon movement of a stage.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Newton's Third Law of motion states that for every action, or force, in nature, there is an equal and opposite reaction. In other words, if object X exerts a force on object Y, then object Y also exerts an equal and opposite force on object X. Reaction mass systems used in mechanical or electromechanical systems, including lithographic processing systems, work under the same principle.

Figure 1B:
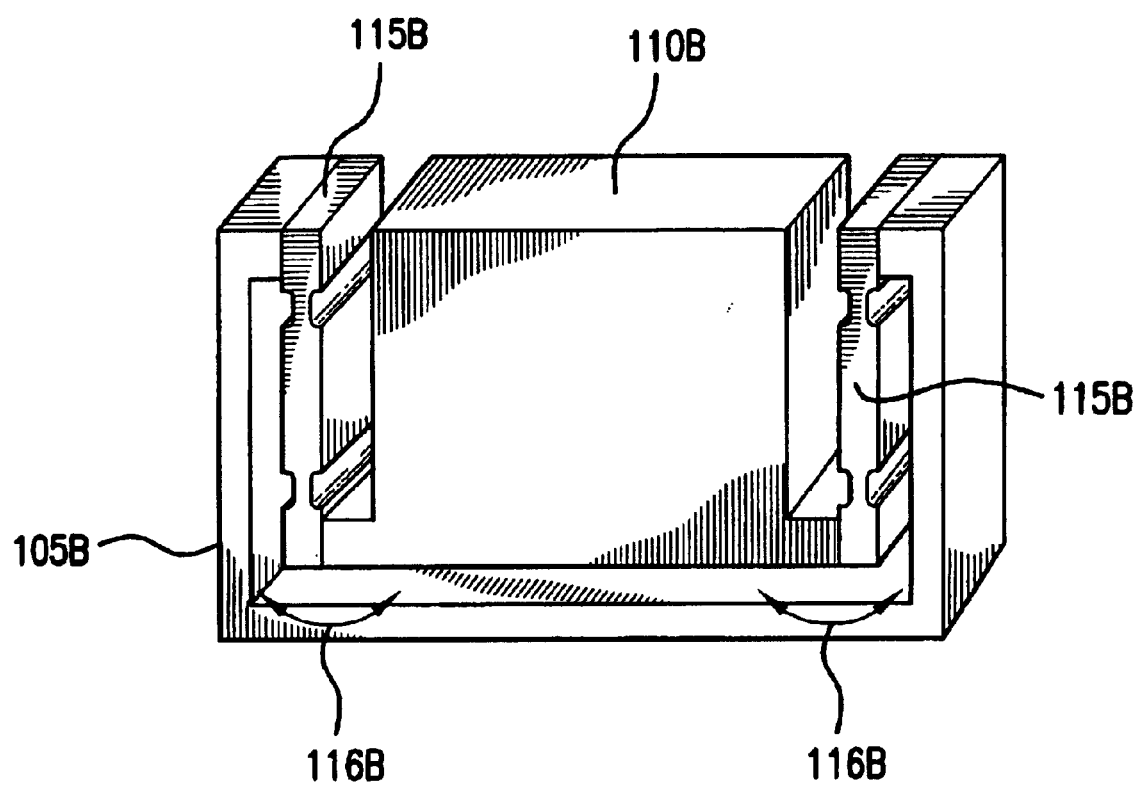
FIG. 1B is an exemplary illustration of a linear spring with flexures that follow a smile-shaped arcuate path upon movement of a stage.
Figure 2:
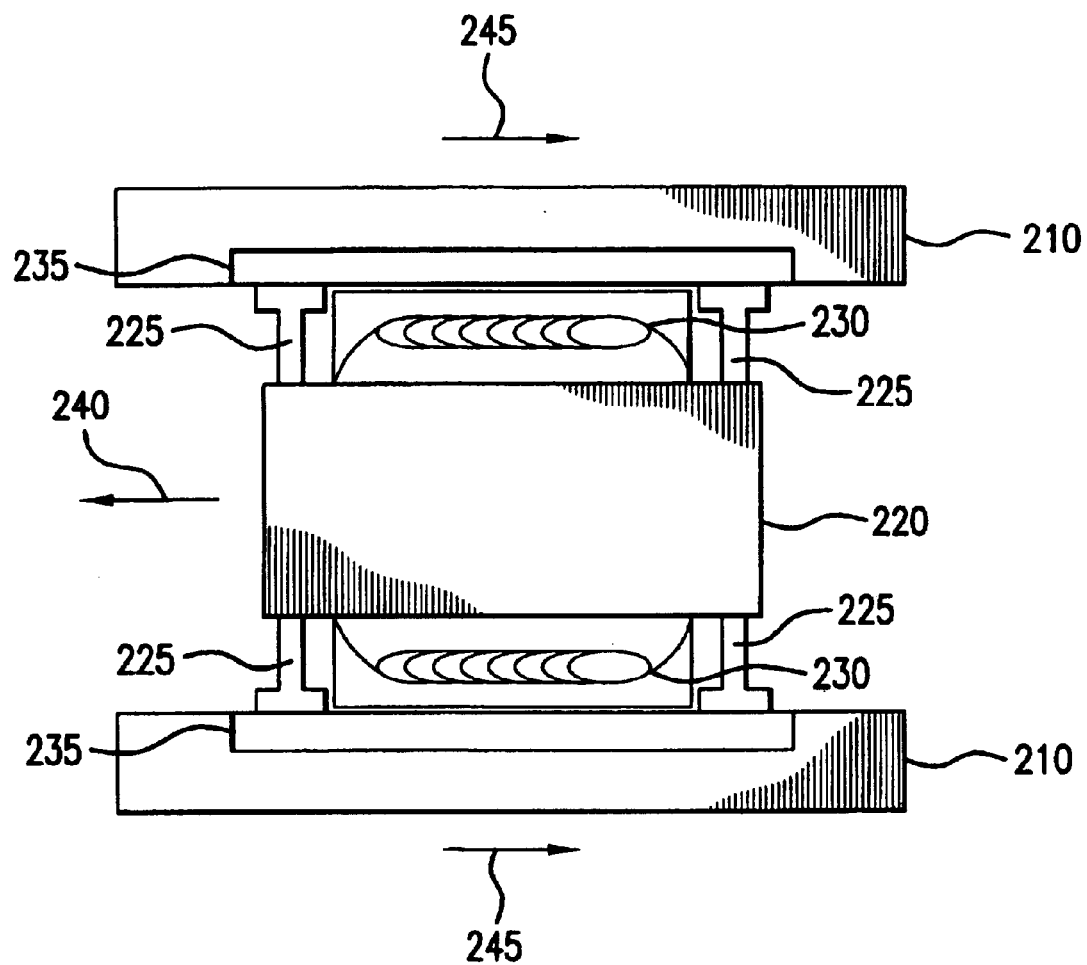
FIG. 2 is an exemplary top-view illustration of a split reaction mass system showing the direction of movement of the reaction masses upon movement of a stage.

Conventional reaction masses 110, 210 are illustrated in FIGS. 1A, 1B, and 2. Flexures can be used to guide one or more reaction masses 110, 210 in high vacuum environments. As depicted in linear spring 100A of FIG. 1A, each reaction mass 110A in a system can be supported by two large vertical flexure plates 115A attached at either end of the reaction mass 110A. One end of each flexure 115A is also coupled to a baseframe 105A of the system. In this way, both ends of a flexure are constrained so that the flexure cannot rotate upon movement of the reaction mass. A stage (not shown) is also coupled to the reaction mass 110A such that when the stage accelerates during processing, this movement causes the reaction mass 110A to accelerate in the opposite direction, in an attempt to stabilize the system. This movement is depicted in top-view split reaction mass system 200 of FIG. 2. In a split reaction mass system, typically there are two reaction masses placed in parallel, with a stage located between them. Note that a reaction mass can be of any shape and does not have to be shaped as depicted in the accompanying figures.

In FIG. 2, stage 220 is coupled to reaction masses 210 via bearings 225. In this example, stage 220 is driven via a conventional linear drive motor consisting of linear coils 230 and magnet arrays 235, each magnet array attached to a reaction mass 210. When stage 220 accelerates in direction 240, the reaction masses accelerate in the opposite direction 245 to compensate, eliminating external reaction loads, and thereby stabilizing the system.

The use of flexures presents a variety of problems. Referring again to FIG. 1A, when both flexures 115A are attached to the baseframe 110A at their bottom end and to the reaction mass at their top end, reaction mass 110A follows a frown-shaped arc 116A upon acceleration of a coupled stage (not shown). In other words, the flexures 115A each shorten with a quadratic error. The effect of the quadratic error is an unbalanced up-and-down motion of the reaction mass. Not only could this cause unwanted movements of the system during lithographic processing, but this also may cause a clearance problem between the bouncing reaction mass 110A and a linear motor, if used. Despite the downsides, one advantage of this configuration is that the gravity moments subtract from flexure moments, which reduces or eliminates the re-centering force.

Similarly, as shown in the depiction of linear spring 100B in FIG. 1B, when both flexures 115B are attached to the baseframe 100B at their top end and to reaction mass 110B at their bottom end, reaction mass 110B follows a smile-shaped arc 116B upon acceleration of a coupled stage (not shown). In other words, the flexures 115B each shorten with a quadratic error, and have similar effects as in the prior example. However, when this occurs, gravity moments plus the flexure moments add to produce a strong re-centering force. The stronger the re-centering force, the larger the load on the reaction masses, therefore requiring larger motors.

Even though linear spring examples 100A and 100B, above, have the advantages of being mechanically compact and able to be designed with very low horizontal stiffness, the disadvantages described above outweigh these advantages. In both examples, the curved motion caused by the quadratic error results in undesirable vertical reaction forces.

As can be seen in the previously-described examples, an action or acceleration by a linear stage in a lithographic processing system may cause various undesirable reactions to those elements directly or indirectly connected to the stage, depending on the configuration used. These undesirable reactions include undesirable movements of the lithographic system, which may degrade or break various mechanical portions of the system over time or may cause diminished quality in lithographic processing.

The present invention provides a simplified, more cost-effective way of using any type of bearings for supporting and guiding a reaction mass located inside a controlled environment. In a controlled environment (e.g., a high vacuum or high purity gas environment), the invention allows the use of bearings while preventing contamination of the environment by contaminants usually associated with bearings, such as gas used in gas bearings or lubricants used in roller bearings. It will be appreciated, however, by those skilled in the art, that the present invention is easily adapted for use in atmospheric pressure as well.

Figure 3:
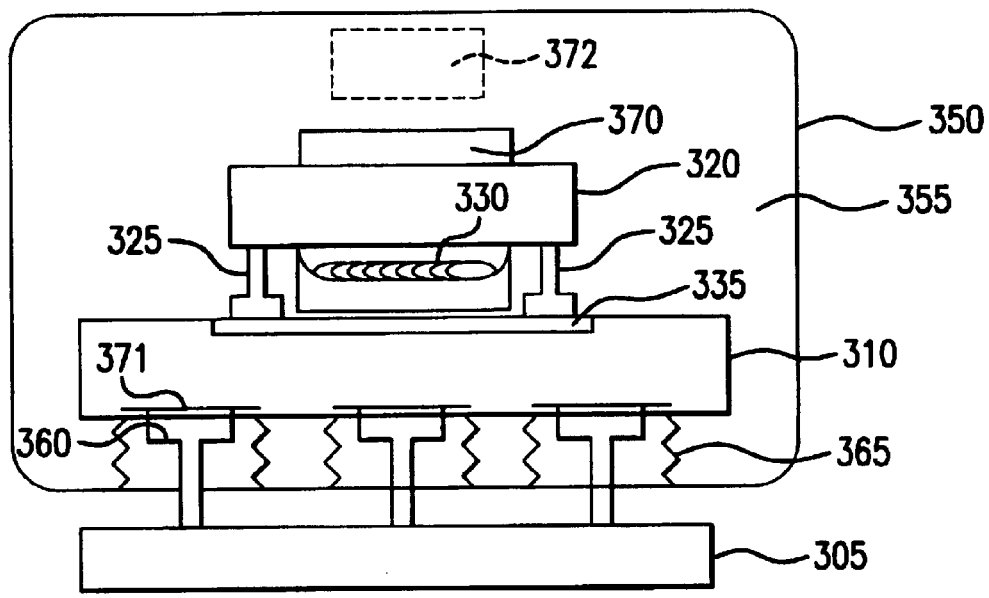
FIG. 3 is an illustration of a reaction mass assembly with bellows in a controlled environment according to an embodiment of the present invention.

A reaction mass mechanism according to the present invention is illustrated in FIG. 3. A reaction mass mechanism assembly 300, shown as a side view, includes a stage 320 coupled to at least one reaction mass 310 via at least two stage bearings 325. Stage 320 can comprise, but is not limited to, a reticle stage or a substrate stage, both used in lithography systems. In this example, stage 320 is a substrate stage, carrying substrate 370. Lithographic exposure means 372 is also shown. Lithographic exposure means 372 includes an illuminator with which to illuminate a mask located on a mask stage and a projection optics with which to project an image of the illuminated mask onto substrate 370 located on substrate stage 320. Stage bearings 325 can be any type of bearing (e.g., ball bearings, roller bearings, wheels, fluid bearings (including liquid or pressurized gas), etc.). However, if used in a controlled environment, stage bearings 325 should be bearings appropriate for this environment. In the embodiment shown, stage 320 is driven via a conventional linear drive motor consisting of linear coil 330 and magnet array 335, the magnet array 335 attached to reaction mass 310.

In an embodiment involving a controlled environment 355, enclosure 350 encloses stage 320 holding substrate 370, reaction mass 310, stage bearings 325, linear drive motor coil 330, and magnet array 335. Enclosure 350 can further enclose lithographic exposure means 372. Reaction mass 310 is supported by at least three baseframe bearings 360 that are coupled to a baseframe 305. In an embodiment, baseframe 305 is uncoupled from enclosure 350, as shown in FIG. 3. In another embodiment, baseframe 305 is coupled to enclosure 350 by rigid supports (not shown). In yet another embodiment, baseframe 305 is coupled to enclosure 350 by flexible supports (not shown).

Figure 4:
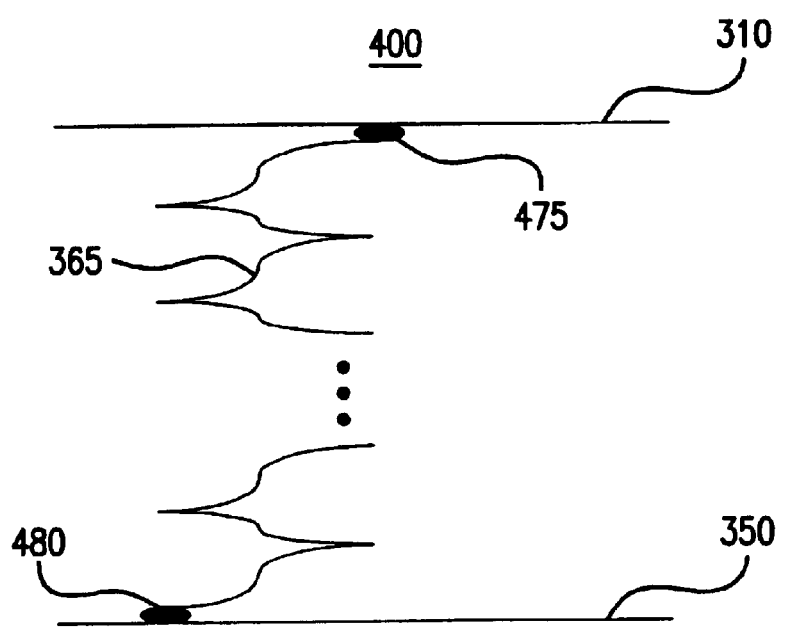
FIG. 4 is a close-up illustration of bellows and bellows connections.

Baseframe bearings 360 can be any type of bearing (e.g., ball bearing, roller bearing, wheel, fluid bearing (including liquid or pressurized gas), etc.). Each baseframe bearing 360 is separated from controlled environment 355 via a bellows 365. Bellows 365 can be made from very thin sheets of metal (such as stainless steel, for example), however other materials can be effectively used. To minimize stiffness in all directions, bellows are generally constructed from as thin a material as practical for their usage. In this type of application, bellows 365 are constructed from material that is on the order of 0.025 cm (approximately 0.01 inch) thick. The inside diameter of bellows 365 must be at least large enough to contain a baseframe bearing 360 plus the length of reaction mass 310 displacement. For bellows 365 of welded construction, it is recommended that the outside diameter be about 5 cm (approximately 2 inches) larger than that of the inner diameter. To achieve a low lateral stiffness, which is desirable to minimize transmitting reaction forces to enclosure 350 through bellows 365, it is recommended that the height of the bellows be about the same or greater than the outside diameter. The tops of the bellows 365 are coupled to reaction mass 310. The bottoms of the bellows 365 are coupled to enclosure 350. In an embodiment, the top of a bellows 365 is coupled to reaction mass 310 via top flange 475, as depicted in FIG. 4. Bellows close-up view 400 also depicts the bottom of bellows 365 coupled to enclosure 350 via bottom flange 480. Bellows 365 can be welded to flange 475, or fastened by other conventional means.

Referring again to FIG. 3, for achieving a leakproof seal between bellows 365 and reaction mass 310, it may be desirable to use a reaction mass 310 made out of a metal instead of the more-common porous granite. For example, reaction mass 310 can be made of stainless steel. Alternatively, metal plates 371 can be coupled to a granite reaction mass, such that the bearings and bellows interface with the metal plates instead of the granite. For example, bearings can slide along metal plates 371. Additionally, bellows 365 can be directly welded to metal plates 371 to produce a leakproof seal.

Bellows 365 are flexible enough to move with the reaction mass, yet form a seal to prevent contaminants related to baseframe bearings 360 from contaminating controlled environment 355. In this way, bellows 365 maintain a pressure separation between the volume of bellows 365 and the volume of controlled environment 355. It will be appreciated that for some embodiments, it is not necessary for enclosure 350 to enclose bellows 365 completely as is shown in FIG. 3. Alternatively, the volume of bellows 365 can be open to the atmosphere, while still maintaining a seal separating the volume of bellows 365 from controlled environment 355.

Bellows 365 have only a limited range of motion. Therefore, bellows 365 need to be large enough to accommodate the size of a baseframe bearing 360 for the required amount of relative motion between the bearing and the reaction mass. It will be appreciated by those skilled in the art that bellows can also be used with stage bearings 325, thus enabling the stage itself to be supported by planar air bearings. However, stage 320 has typically a much larger range of motion than its associated reaction masses, which may be too large for ordinary metal bellows to accommodate.

As described earlier herein, upon movement in one direction of a stage in a lithography system, the reaction mass(es) coupled to the stage will move in the opposite direction to prevent the transfer of the reaction force to the rest of the lithography system. The mass of the stage and the reaction mass(es) determine how far the reaction mass will need to move for this reaction force compensation. Applying the principle of conservation of momentum to an example, if the total mass of the reaction mass is X times greater than the mass of the stage, then the reaction mass will move, in the opposite direction as the stage, a total of 1/X the distance of the stage. The coil portion of the linear motor supplies a force equal to the stage mass times the acceleration of the stage. The magnet track portion of the linear motor experiences an equal and opposite force, which it transfers to the reaction mass, accelerating it at 1/X the rate of the stage. The vacuum chamber experiences a horizontal force equal to the combined lateral stiffness of the bellows times the displacement of the reaction mass. If the vacuum chamber is uncoupled from the baseframe, the baseframe experiences no reaction force. An additional advantage of this setup is that the center of gravity of the entire structure of the lithography system remains in place, thus the baseframe experiences no tilting moments due to shifts in the center of gravity of the components that it supports.

Referring to FIG. 3, for example, if stage 320 moves 300 mm (approximately 12 inches), and reaction mass 310 weighs 10 times greater than stage 320, then reaction mass 310 will move 1/10 the distance of stage 320 (i.e., reaction mass 310 will move 30 mm (approximately 1.2 inches)). In other words, the heavier the reaction mass, the shorter the distance the reaction mass will need to move in order to perform reaction force compensation. It will be appreciated that a heavy reaction mass does not necessarily mean a large reaction mass. The present invention is most effectively used with a heavier reaction mass that only requires movement of a small distance. For heavier reaction masses that only require traveling a short distance, short bearings can be used because the bellows will not need to flex very far. Bellows allow only a limited range of motion and therefore are more effective when used with reaction masses that only require traveling a short distance.

It will be appreciated that as few as three baseframe bearings can be used to support the reaction mass at three non-colinear points defining a plane. It will also be appreciated that there is no need for the baseframe bearings to be along the entire length of the reaction mass.

Figure 5:
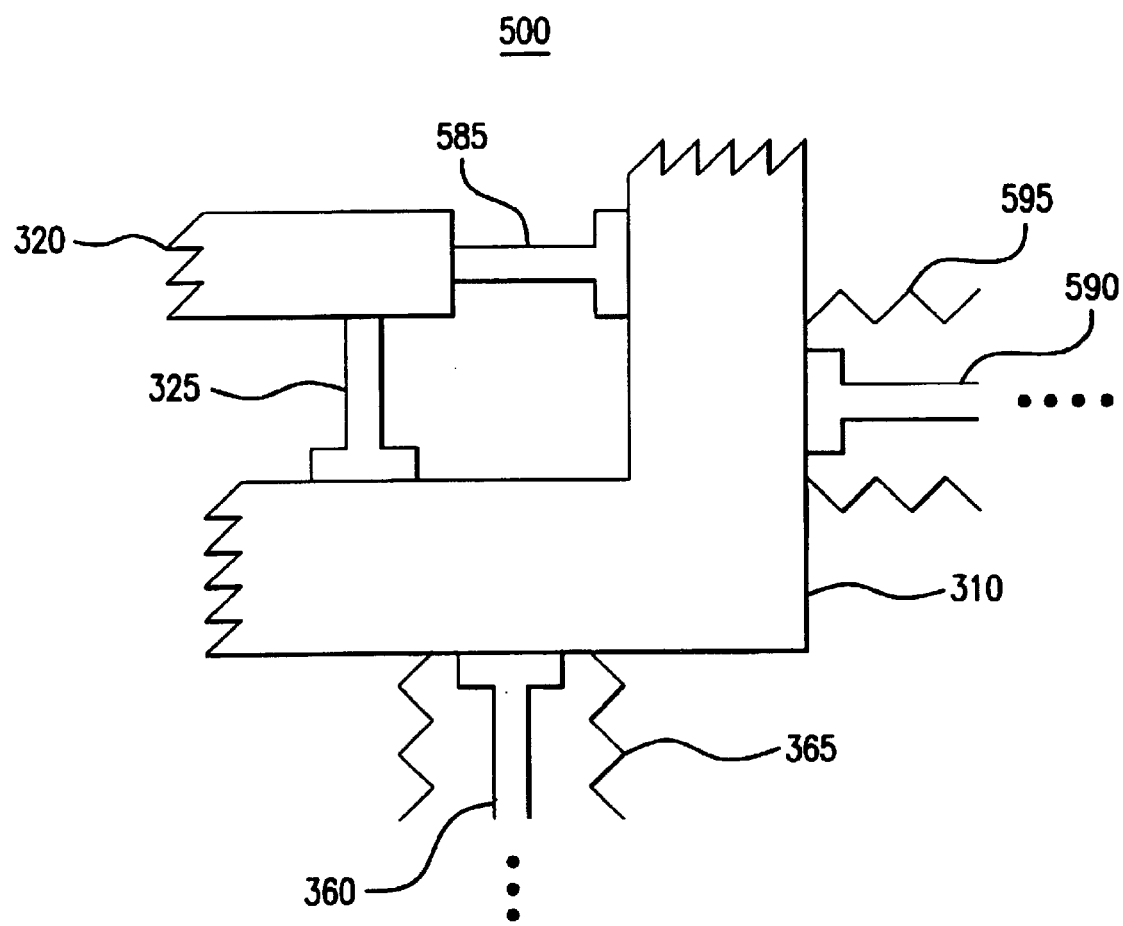
FIG. 5 is a partial illustration of a side view of a reaction mass assembly with bellows according to an embodiment of the present invention.

A partial side view of a reaction mass bearing arrangement, according to an embodiment of the present invention, is depicted in FIG. 5. As partial side view 500 illustrates, an embodiment of the present invention includes reaction mass 310 shaped in such a way as to allow the use of at least one additional bearing alongside stage 320 and reaction mass 310 in a plane perpendicular to the plane defined by baseframe bearings 360. For example, baseframe side guidance bearings 590 along with baseframe side guidance bellows 595 linearly guide reaction mass 310. Baseframe side guidance bearings 590 and baseframe side guidance bellows 595 are basically baseframe bearings 360 and bellows 365 repositioned to the side of reaction mass 310. Similarly, stage side guidance bearings 585 linearly guide stage 320. Stage side guidance bearings 585 are basically stage bearings 325 repositioned to the side of stage 320. These side support bearings 585, 590 horizontally guide the movement of stage 320 and reaction mass 310 during lithography.

CONCLUSION

Among the many discussed advantages of this invention, the embodiments of this invention provide reaction mass bearing arrangements for lithography systems that are far simpler than compound flexure arrangements that have been proposed. Unlike simple flexure guides, this invention produces substantially straight or in-plane motion as opposed to arcuate motion, while keeping cost, size, and weight of the system low. The invention also provides very effective reaction mass bearing arrangements for lithography systems used in controlled environments that are not restrained to using non-contaminant types of bearings.

While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A reaction mass apparatus comprising:
   a baseframe;
   at least one reaction mass, movably coupled to said baseframe by at least three first bearings, and coupled to a stage by at least two second bearings and at least one drive; and
   a plurality of bellows, each of said plurality of bellows surrounding a corresponding one of said at least three first bearings, wherein each of said plurality of bellows has a first end coupled to said at least one reaction mass.

2. The apparatus of claim 1, wherein each of said plurality of bellows has a second end coupled to said baseframe.

3. The apparatus of claim 1, wherein said at least three first bearings are fluid bearings.

4. The apparatus of claim 3, wherein said fluid is a pressurized gas.

5. The apparatus of claim 3, wherein said fluid is a liquid film.

6. The apparatus of claim 1, wherein said at least three first bearings are roller bearings.

7. The apparatus of claim 1, wherein said at least three first bearings are ball bearings.

8. The apparatus of claim 1, wherein said at least one drive each comprises:
   a linear motor coil coupled to said stage; and
   a magnet array coupled to one of said at least one reaction mass,
   wherein said linear motor coil and said magnet array are coupled magnetically.

9. The apparatus of claim 1, further comprising:
   an enclosure having a controlled environment and enclosing said stage, said at least two second bearings, said at least one drive, and said at least one reaction mass,
   wherein each of said plurality of bellows separates said corresponding first bearing from said controlled environment.

10. The apparatus of claim 9, wherein each of said plurality of bellows has a second end coupled to said enclosure.

11. The apparatus of claim 9, wherein a volume enclosed by each of said plurality of bellows has a pressure independent of the volume enclosed by said enclosure.

12. The apparatus of claim 9, wherein a flange couples said bellows first end to one of said at least one reaction mass.

13. The apparatus of claim 12, wherein said flange comprises a sliding surface for an enclosed first bearing.

14. The apparatus of claim 9, wherein a flange couples said bellows second end to said enclosure.

15. The apparatus of claim 9, wherein said baseframe is uncoupled from said enclosure.

16. The apparatus of claim 9, wherein said baseframe is coupled to said enclosure via rigid supports.

17. The apparatus of claim 9, wherein said baseframe is coupled to said enclosure via flexible supports.

18. The apparatus of claim 9, wherein said enclosure further encloses lithographic exposure means.

19. The apparatus of claim 1, wherein a flange couples said bellows first end to one of said at least one reaction mass.

20. The apparatus of claim 1, wherein a flange couples said bellows second end to said baseframe.

21. The apparatus of claim 1, wherein at least one of said first bearings is positioned such that it linearly guides one of said at least one reaction mass.

22. The apparatus of claim 1, wherein the mass of said stage is X times less than the mass of said at least one reaction mass, resulting in said at least one reaction mass moving, upon movement of said stage, a distance 1/X the distance of said stage.

23. The apparatus of claim 1, wherein said at least one reaction mass is made of metal.

24. The apparatus of claim 1, wherein each of said plurality of bellows is made of metal.

25. A scanning apparatus used for lithographic processing within a controlled environment, comprising:
   lithographic exposure means;
   a baseframe;
   at least one reaction mass movably coupled to said baseframe by at least three first bearings;
   a stage, coupled to said at least one reaction mass by at least two second bearings and at least one drive;
   an enclosure, having a controlled environment and enclosing said lithographic exposure means, said stage, said at least two second bearings, said at least one drive, and said at least one reaction mass; and
   a plurality of bellows, each of said plurality of bellows surrounding a corresponding one of said at least three first bearings and separating said corresponding first bearing from said controlled environment, wherein each of said plurality of bellows has first end coupled to said at least one reaction mass and a second end coupled to said enclosure.

26. The scanning apparatus of claim 25, wherein said at least three first bearings are fluid bearings.

27. The scanning apparatus; of claim 26, wherein said fluid is a pressurized gas.

28. The scanning apparatus of claim 26, wherein said fluid is a liquid film.

29. The scanning apparatus of claim 25, wherein said at least three first bearings are roller bearings.

30. The scanning apparatus of claim 25, wherein said at least three first bearings are ball bearings.

31. The scanning apparatus of claim 25, wherein said at least one drive each comprises:
   a linear motor coil coupled to said stage; and
   a magnet array coupled to one of said at least one reaction mass,
   wherein said linear motor coil and said magnet array are coupled magnetically.

32. The scanning apparatus of claim 25, wherein a volume enclosed by each of said plurality of bellows has a pressure independent of the volume enclosed by said enclosure.

33. The scanning apparatus of claim 25, wherein a flange couples said bellows first end to one of said at least one reaction mass.

34. The scanning apparatus of claim 25, wherein a flange couples said bellows second end to said enclosure.

35. The scanning apparatus of claim 25, wherein said baseframe is uncoupled from said enclosure.

36. The scanning apparatus of claim 25, wherein said baseframe is coupled to said enclosure via rigid supports.

37. The scanning apparatus of claim 25, wherein said baseframe is coupled to said enclosure via flexible supports.

38. The scanning apparatus of claim 25, wherein at least one of said first bearings is positioned such that it linearly guides one of said at least one reaction mass.

39. The scanning apparatus of claim 25, wherein the mass of said stage is X times less than the mass of said at least one reaction mass, resulting in said at least one reaction mass moving, upon movement of said stage, a distance 1/X the distance of said stage.

40. The scanning apparatus of claim 25, wherein said at least one reaction mass is made of metal.

41. The scanning apparatus of claim 25, wherein each of said plurality of bellows is made of metal.

* * * * *

UNITED STATES PATENT AND TRADEMARK OFFICE
CERTIFICATE OF CORRECTION

PATENT NO. : 6,947,125 B2
DATED : September 20, 2005
INVENTOR(S) : Santiago E. del Puerto It is certified that error appears in the above-identified patent and that said Letters Patent is hereby corrected as shown below:

Title page,
Item [56], References Cited, U.S. PATENT DOCUMENTS, delete "2002/0105481" and insert -- 2002/0102481 --.

Column 10,
Line 47, the semi-colon after "apparatus" should be deleted.

Signed and Sealed this

Seventeenth Day of January, 2006

JON W. DUDAS
*Director of the United States Patent and Trademark Office*